(12) United States Patent
Fernandez

(10) Patent No.: US 9,236,836 B2
(45) Date of Patent: Jan. 12, 2016

(54) SIGNAL PROCESSING FOR DIGITAL NETWORK ANALYZER

(71) Applicant: Keysight Technologies, Inc., Minneapolis, MN (US)

(72) Inventor: Andrew D. Fernandez, San Jose, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 85 days.

(21) Appl. No.: 14/140,307

(22) Filed: Dec. 24, 2013

(65) Prior Publication Data

US 2015/0180416 A1  Jun. 25, 2015

(51) Int. Cl.
| | |
|---|---|
| *H04B 17/00* | (2015.01) |
| *H04B 1/26* | (2006.01) |
| *G01R 23/16* | (2006.01) |
| *G01R 23/14* | (2006.01) |
| *H03D 7/14* | (2006.01) |
| *H04B 1/00* | (2006.01) |

(52) U.S. Cl.
CPC .............. *H03D 7/1466* (2013.01); *H04B 1/00* (2013.01)

(58) Field of Classification Search
USPC ............ 455/67.11, 67.7, 226.1, 226.2, 226.4, 455/323; 324/612, 76.19, 76.21, 76.23
See application file for complete search history.

(56) References Cited

U.S. PATENT DOCUMENTS

| | | | |
|---|---|---|---|
| 7,801,505 B2 | 9/2010 | VanWiggeren et al. | |
| 8,841,923 B1 * | 9/2014 | Vanwiggeren | 324/606 |
| 2009/0216468 A1 * | 8/2009 | Anderson | 702/57 |

\* cited by examiner

*Primary Examiner* — Nguyen Vo

(57) ABSTRACT

A method is provided for processing a radio frequency (RF) signal output by a device under test (DUT), the RF signal having first comb lines in a predetermined first order. The method includes mixing and filtering the RF signal with a multi-tone local oscillator (LO) signal to provide an intermediate frequency (IF) signal having second comb lines corresponding to the first comb lines, where the mixing operation scrambles in frequency the first comb lines of the RF signal such that the second comb lines of the IF signal are in a second order different from the predetermined first order; digitizing the IF signal at a predetermined sampling rate; and descrambling the digitized IF signal with time domain signal processing such that the second comb lines of the digitized IF signal are arranged in the predetermined first order.

20 Claims, 12 Drawing Sheets

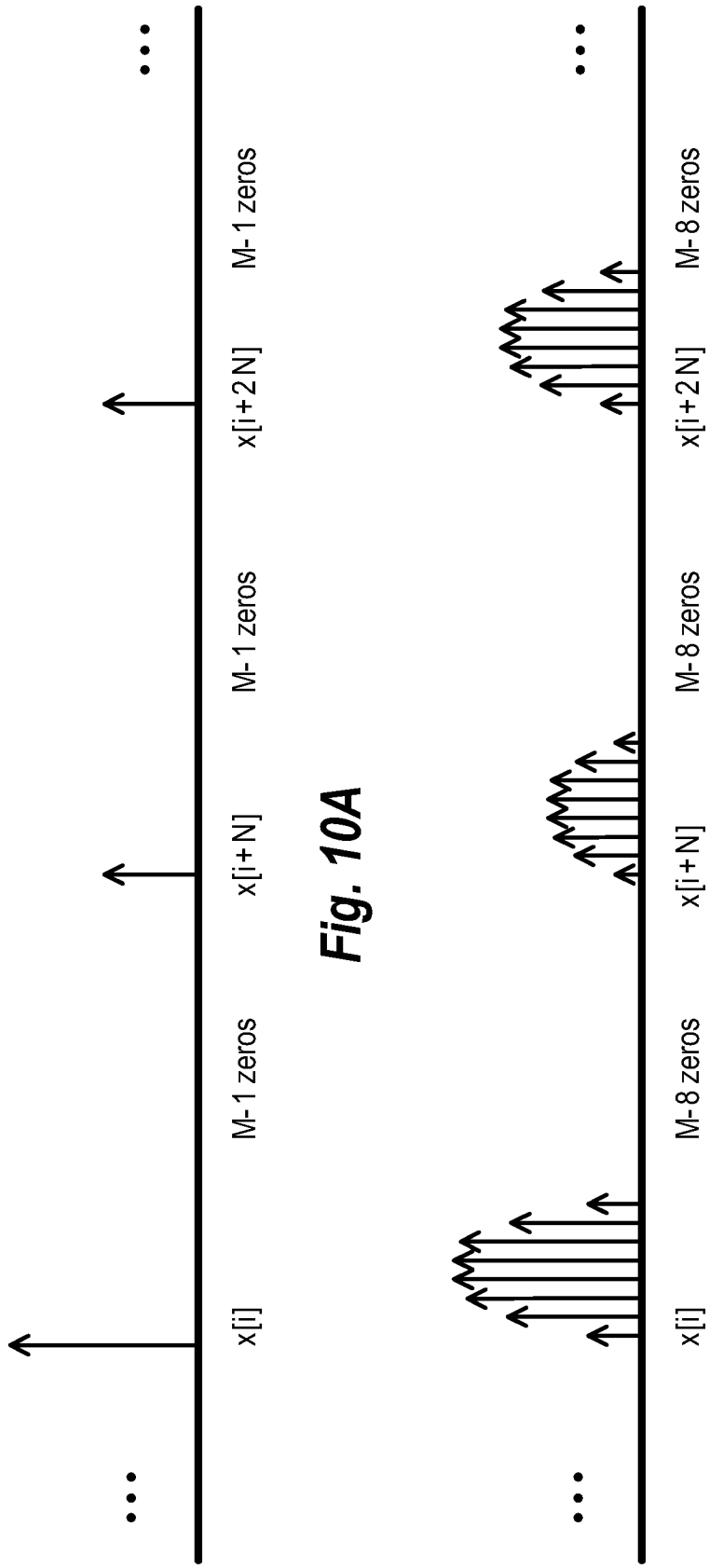

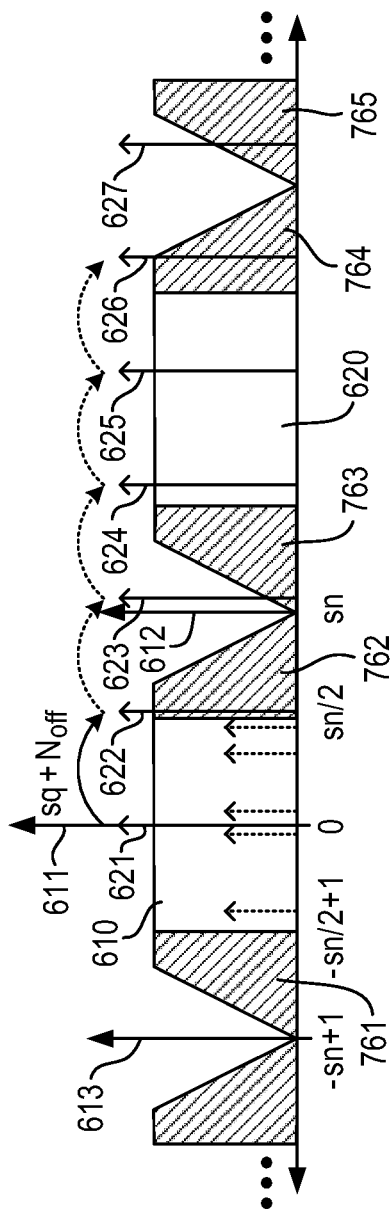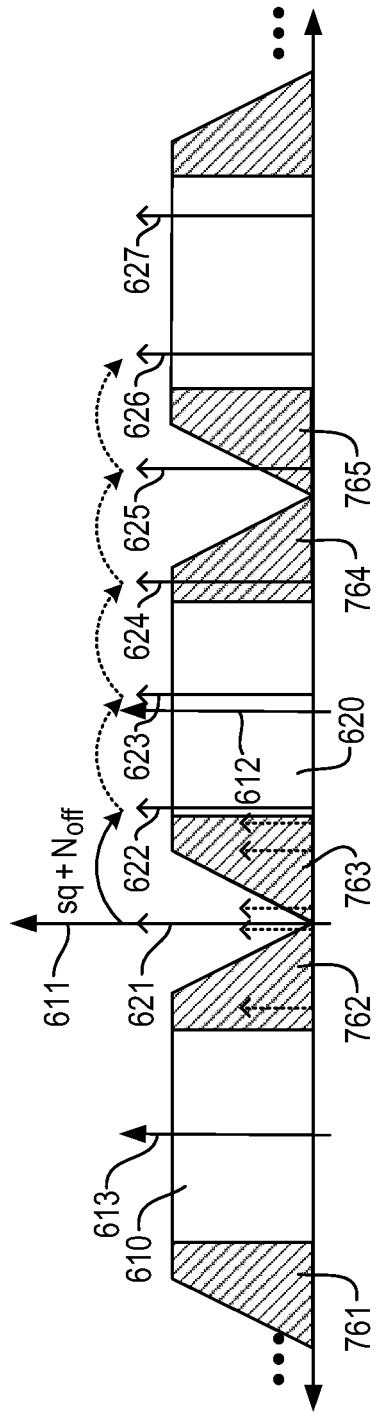

SIGNAL PROCESSING FOR DIGITAL NETWORK ANALYZER

BACKGROUND

A digital network analyzer (DNA) generally describes a network analyzer architecture that generates a digital stimulus pattern for system identification and a corresponding receiver architecture that recovers the system response. The DNA architecture also mixes the response with a digital mixing pattern, chosen so that mixing products of interest lie within a narrow intermediate frequency (IF). This enables the receiver architecture to measure broadband energy (resulting from broadband stimulus) using a commodity analog-to-digital converter (ADC), without requiring swept local oscillators (LO), for example. Since the broadband stimulus is acquired concurrently, rather than sequentially as with a swept LO, the DNA may be orders of magnitude faster than a traditional (swept LO) network analyzer. Further, the DNA is able to trade signal-to-noise ratio (SNR) for measurement time to a great extent and avoids LO settling times, band crossings, and the like.

The DNA receiver architecture captures a frequency compressed and frequency scrambled version of the broadband stimulus signal, which must be descrambled to recover the measurement. "Descrambling" means two things. First, one must identify the frequencies of interest. Typically, only 10 percent or fewer of captured frequencies are actually used in the measurement. Second, one must return the identified frequencies of interest to the original order as they appeared in the stimulus signal. However, conventional methods for deciphering the scrambled version of the broadband stimulus signal are orders of magnitude slower than the time required to acquire the broadband stimulus signal, as reflected by traces 120 and 130 in FIG. 1. This is primarily because conventional descrambling algorithms are implemented in the frequency domain. More specifically, the process includes accumulating one or more periods of the waveform of an IF signal, coherently averaging (also known as bin and average operation) the accumulated periods to improve SNR, performing a fast Fourier transform (FFT) on the coherently averaged IF signal, and extracting frequencies and phases of the frequency bins of interest. For example, extracting the frequencies and phases of the frequency bins of interest may use a special indexing function to identify locations of the frequency bins of interest (since the frequency bins of interest have been scrambled during the IF mixing operation).

The conventional descrambling algorithm tends to be time consuming. This is because the digital stimulus pattern of the RF signal, and consequently the period(s) of the IF signal, can become rather long, particularly for fine frequency resolutions. The period of the IF signal may be millions of samples in length. As, the FFT is performed on the entire captured waveform, the processing time can be significantly slower than the acquisition time. Also, transferring such a long record to a host computer (e.g., personal computer) takes time. The capture memory for performing the coherent averaging also must be sufficiently deep. The number of samples processed with this approach is proportional to the reciprocal of the measurement's frequency resolution, even for narrow measurement spans. Unfortunately, because of the scrambling introduced by the mixing process, there has been no efficient way to selectively compute just the frequency bins of interest. The number of samples in the IF period can be 10 times, 100 times or even more, the number of frequency bins that are actually retained from the FFT. Typically, though, the data transfer time and the digital signal processing (DSP) time are much longer than the acquisition time.

For example, FIG. 1 is a graph depicting time versus frequency resolution of various functions of a conventional DNA. Trace 110 of FIG. 1 shows acquisition time ($T_{acq}$) that it takes to acquire the digitized IF signal data (e.g., corresponding to period of the IF waveform), not including signal processing time. As would be expected, the time for IF signal data acquisition decreases as the desired frequency resolution decreases. Trace 120 shows the acquisition time ($T_{acq}$) plus transfer time ($T_{transfer}$), which is the time required for the acquired IF signal data to be stored in capture memory and transferred to an FFT module for DSP. Trace 130 shows the acquisition time ($T_{acq}$) and the transfer time ($T_{transfer}$) plus FFT time ($T_{dsp}$), which is the time required to perform FFTs on the IF signal data stored in capture memory. As a practical matter, the trace 130 represents the full amount time to complete a measurement using the conventional DNA. Trace 140, provided for purposes of comparison, shows measurement time of a conventional, very fast vector network analyzer (VNA), which performs measurements at a constant speed, responsive to the sweep time of the LO (as opposed to the period of the IF signal waveform). As shown in FIG. 1, if the DNA's measurement time were reduced to effectively match the acquisition time ($T_{acq}$), e.g., by reducing the transfer time ($T_{transfer}$) and the FFT time ($T_{dsp}$), it would be significantly faster than the conventional VNA, particularly as frequency resolution decreases.

Accordingly, there is a need for a solution capable of accelerating the IF signal data transfer and processing functions, including descrambling operations, such that DNA measurements may be limited primarily by the data acquisition speed. This would further enable DNA measurements to be obtained and observed in real-time or near real-time.

SUMMARY

In a representative embodiment, a method is provided for processing a radio frequency (RF) signal output by a device under test (DUT), the RF signal having multiple first comb lines in a predetermined first order. The method includes mixing and filtering the RF signal with a multi-tone local oscillator (LO) signal to provide an intermediate frequency (IF) signal having multiple second comb lines corresponding to the multiple first comb lines, where the mixing scrambles in frequency the first comb lines of the RF signal such that the second comb lines of the IF signal are in a second order different from the predetermined first order; digitizing the IF signal at a predetermined sampling rate; and descrambling the digitized IF signal with time domain signal processing such that the second comb lines of the digitized IF signal are arranged in the predetermined first order.

In another representative embodiment, a digital network analyzer includes a mixer, an analog-to-digital converter (ADC), and a descrambling module. The mixer is configured to mix an RF signal output from a DUT and a multi-tone LO signal output from an LO signal generator for providing an IF signal, where the RF signal includes first comb lines arranged in a predetermined first order, the LO signal includes an LO pattern, and the IF signal includes second comb lines corresponding to the first comb lines and arranged in a second order different from the first order. The ADC is configured to digitize the IF signal at a predetermined sampling rate. The descrambling module is configured to descramble the digitized IF signal with time domain signal processing such that the second comb lines of the digitized IF signal are rearranged in the predetermined first order.

BRIEF DESCRIPTION OF THE DRAWINGS

The representative embodiments are best understood from the following detailed description when read with the accompanying drawing figures. Wherever applicable and practical, like reference numerals refer to like elements.

FIG. 10A illustrates a time domain IF record after upsampling by upsampling modules of a DNA, according to a representative embodiment.

FIG. 10B illustrates a time domain IF record after resampling by resampling modules of a DNA, according to a representative embodiment.

FIG. 11A is a frequency domain view of upsampled spectral line frequencies of a filtered IF signal on a first path, according to a representative embodiment.

FIG. 11B is a frequency domain view of upsampled spectral line frequencies of a filtered IF signal after circular rotation on a second path, according to a representative embodiment.

DETAILED DESCRIPTION

Figure 1:
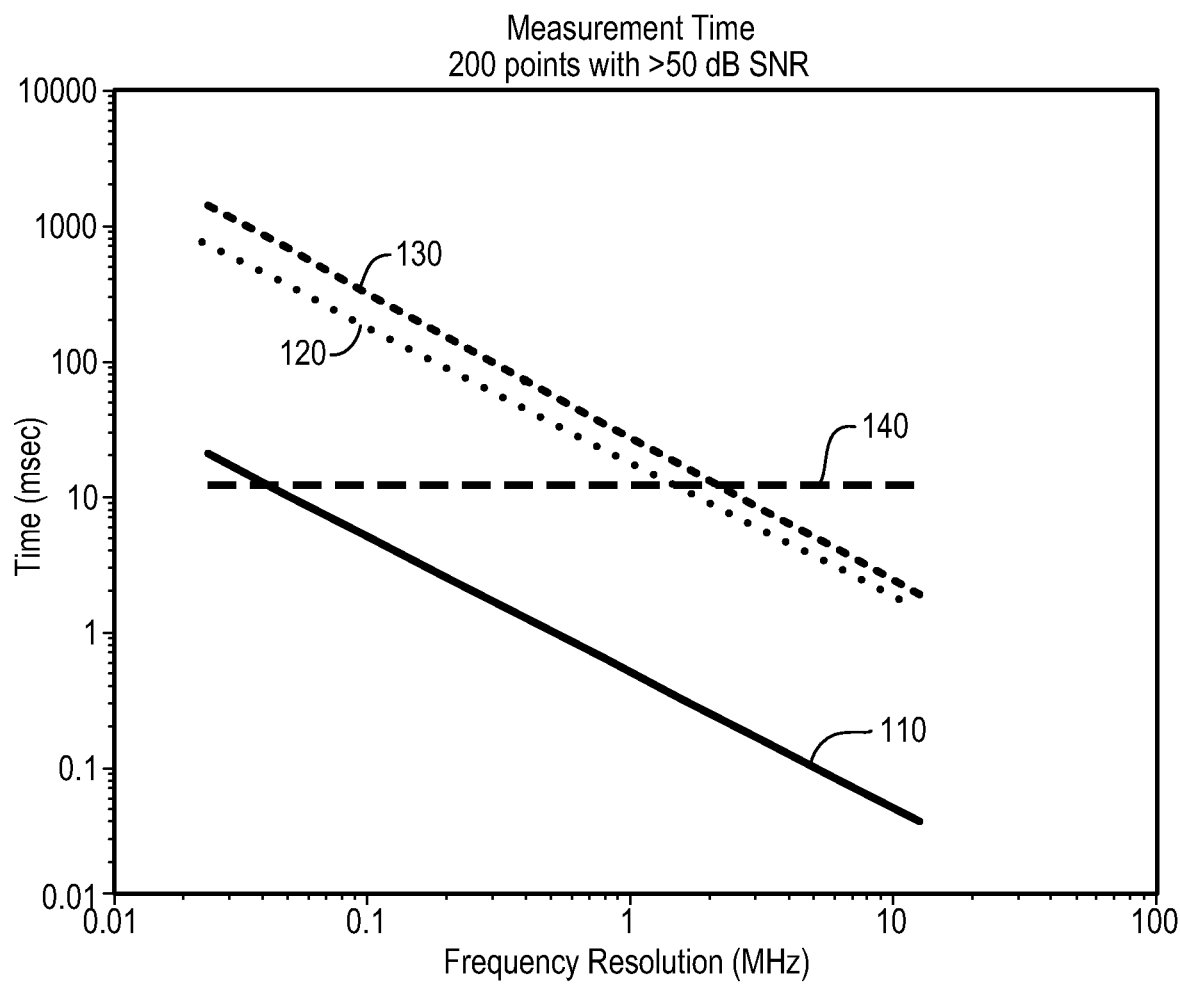
FIG. 1 is a graph depicting time versus frequency resolution of various functions of a conventional DNA.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

The present teachings relate to descrambling mixing products (e.g., "frequencies of interest" or "frequency bins of interest") in an intermediate frequency (IF) signal generated by a mixing operation of a radio frequency (RF) signal output by a device under test (DUT), e.g., in response to an RF stimulus signal, and a local oscillator (LO) signal. According to various embodiments, the amount of data from the IF signal is significantly reduced prior to processing and transfer, thereby reducing total processing and transfer time to be equal to about the data acquisition time. More particularly, according to various embodiments, the number of processing samples is proportional to the number of measurement points in the span, instead of being proportional to the inverse of resolution bandwidth, resulting in a reduction in processing time by about 10 times to about 1000 times. Accordingly, the disclosed embodiments are orders of magnitude faster than conventional approaches, enabling network analysis measurements to be performed on the order of the data acquisition time. Also, less capture memory is required, which simplifies board design, for example, and thus lowers over costs. Likewise, the need for designing out acquisition memory chips and/or microprocessors for FFT processing is significantly reduced.

Figure 2:
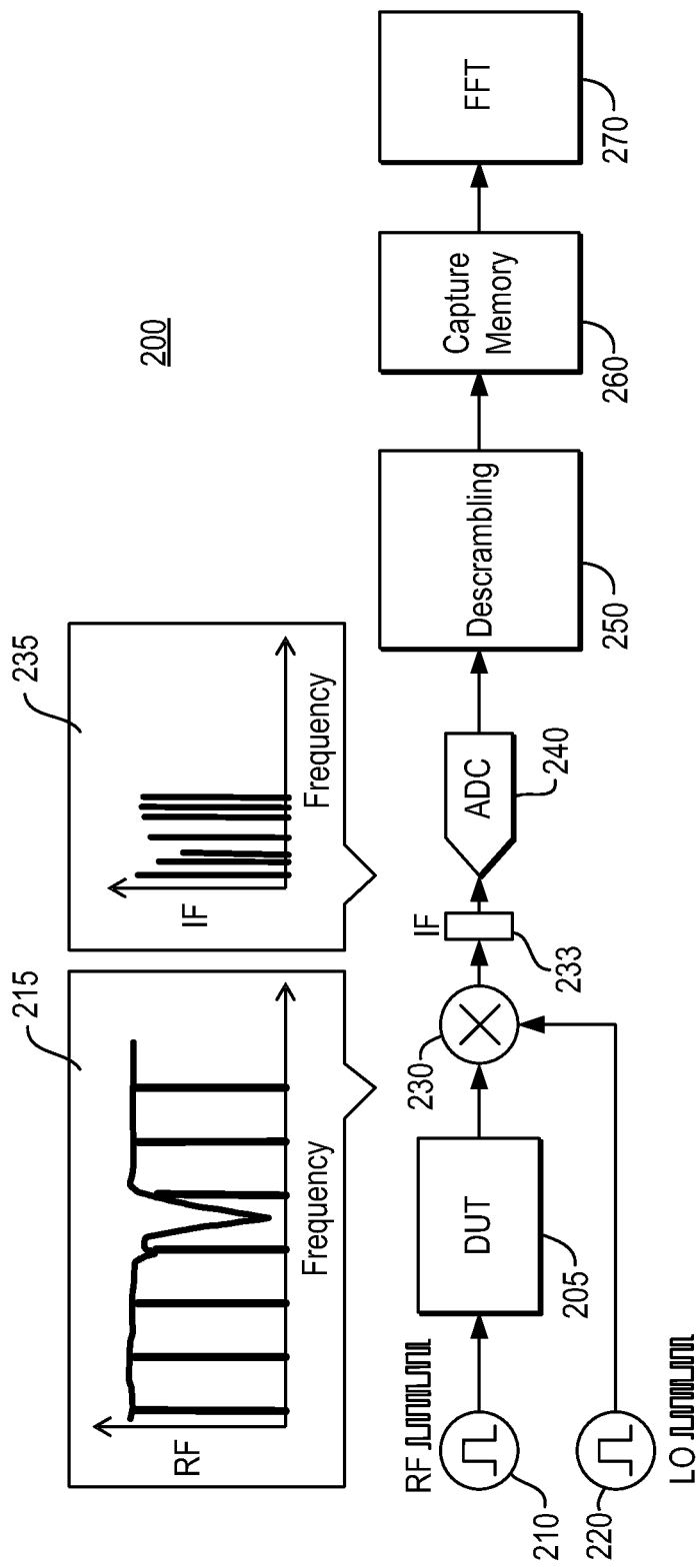
FIG. 2 is a simplified block diagram of a digital network analyzer (DNA) configured to process a radio frequency (RF) signal output by a device under test (DUT), according to a representative embodiment.

FIG. 2 is a simplified block diagram of a digital network analyzer (DNA) configured to process an RF signal output by a DUT, according to a representative embodiment.

Referring to FIG. 2, DNA 200 includes an RF signal generator 210, an LO signal generator 220 and a mixer 230. The RF signal generator 210 is configured to generate a multi-tone RF stimulus signal, which has a wideband digital stimulus pattern (or "RF pattern"), and to provide the RF stimulus signal to DUT 205. The DUT 205 outputs an RF signal responsive to the RF stimulus signal, where the RF signal from the DUT 205 includes first comb lines 215, arranged in a predetermined first order, corresponding to the RF pattern of the RF stimulus signal. In an embodiment, the DUT 205 itself may be a signal generator, in which case the DUT 205 simply generates the RF signal with the RF pattern. The LO signal generator 220 is configured to generate a multi-tone LO signal having a wideband digital mixing pattern (or "LO pattern"). The mixer 230 is configured to mix the RF signal output by the DUT 205 and the LO signal output by the LO signal generator 220 to provide an IF signal. The mixer 230 may be followed by a low pass filter (LPF) 233 for filtering the mixed RF and LO signals to provide the IF signal.

The IF signal output by the mixer 230 includes mixing products (e.g., "frequencies of interest" or "frequency bins of interest") resulting from mixing the RF signal and the LO signal. As discussed further below, the RF pattern of the RF stimulus signal and the LO pattern of the LO signal are designed so that mixing products in the IF signal do not overlap, an example of which is described by Van Wiggeren et al. in U.S. Pat. No. 7,801,505 (issued Sep. 21, 2010), which is hereby incorporated by reference in its entirety. Among the mixing products in the IF signal are second comb lines 235, which correspond to the first comb lines 215. However, the mixing operation performed by the mixer 230 "scrambles" (e.g., rearranges the order of) the frequencies of the first comb lines 215 of the RF signal, such that the second comb lines 235 of the IF signal are in a second order different from the predetermined first order. Also, the second comb lines 235 have different magnitudes, respectively, and are compressed (closer together) in frequency, generally due to down conversion from the RF signal frequency to the IF signal frequency. For purposes of illustration, there are seven first and second comb lines 215 and 235 depicted, although any number of first and second comb lines 215 and 235 may result from the mixing and/or be selected for measurement without departing from the scope of the present teachings.

The DNA 200 further includes an analog-to-digital converter (ADC) 240, a descrambling module 250, a capture memory 260 and an FFT module 270. The ADC 240 digitizes the IF signal (including the second comb lines 235) at a predetermined sampling rate to provide a digitized IF signal. The ADC 240 may have a relatively low frequency sampling rate for extracting amplitude and phase of each of the second comb lines 235. The predetermined sampling rate used for digitizing the IF signal may be compatible with sampling a period of the IF signal. The descrambling module 250 is configured to "descramble" the digitized IF signal in the time domain (with time domain signal processing), outputting a descrambled IF signal. In particular, the descrambling effectively rearranges or restores the second comb lines 235 of the digitized IF signal to the predetermined first order of the first comb lines 215. Examples of the descrambling operation are discussed below with reference to FIGS. 3 and 11, below, illustrating embodiments of the descrambling module 250. The capture memory 260 receives the descrambled IF signal from the descrambling module 250, and stores frequency bins of interest, which include the (rearranged) second comb lines 235. Storing the frequency bins of interest may include storing any contiguous subset of the first comb lines 215. The FFT module 270 performs FFTs on the stored frequency bins of interest of the descrambled IF signal to provide frequency domain samples corresponding to the frequency bins of interest of the digitized IF signal. In alternative embodiments, the FFT module 270 may receive the frequency bins of interest directly from the descrambling module 350 to provide the frequency domain samples corresponding to the digitized IF signal, without departing from the scope of the present teachings.

Performing the descrambling operation in the time domain as opposed to the frequency domain (as done by conventional DNAs) reduces the time and amount of processing needed to measure the digitized IF signal. For example, in conventional DNAs, the amount of data stored and the number of FFTs performed depend on the number of samples in a repetitive period of the waveform of the IF signal in order to analyze measurement results. In comparison, according to representative embodiments, only frequency bins of interest (e.g., including the second comb lines 235), which are provided by coherent averaging of the digitized IF signal (discussed below), are stored and subject to FFT processing. Accordingly, the signal processing is much faster. In fact, the signal processing may be shorter than the acquisition time by the ADC 240, thus enabling measurement to occur in real-time (or near real-time), on the order of the acquisition time. In addition, because of the data reduction, all processing and storage may be accomplished on-chip, such as a field-programmable gate array (FPGA) or a dedicated application specific integrated circuits (ASIC), for example, thereby enabling improved integration.

Figure 3:
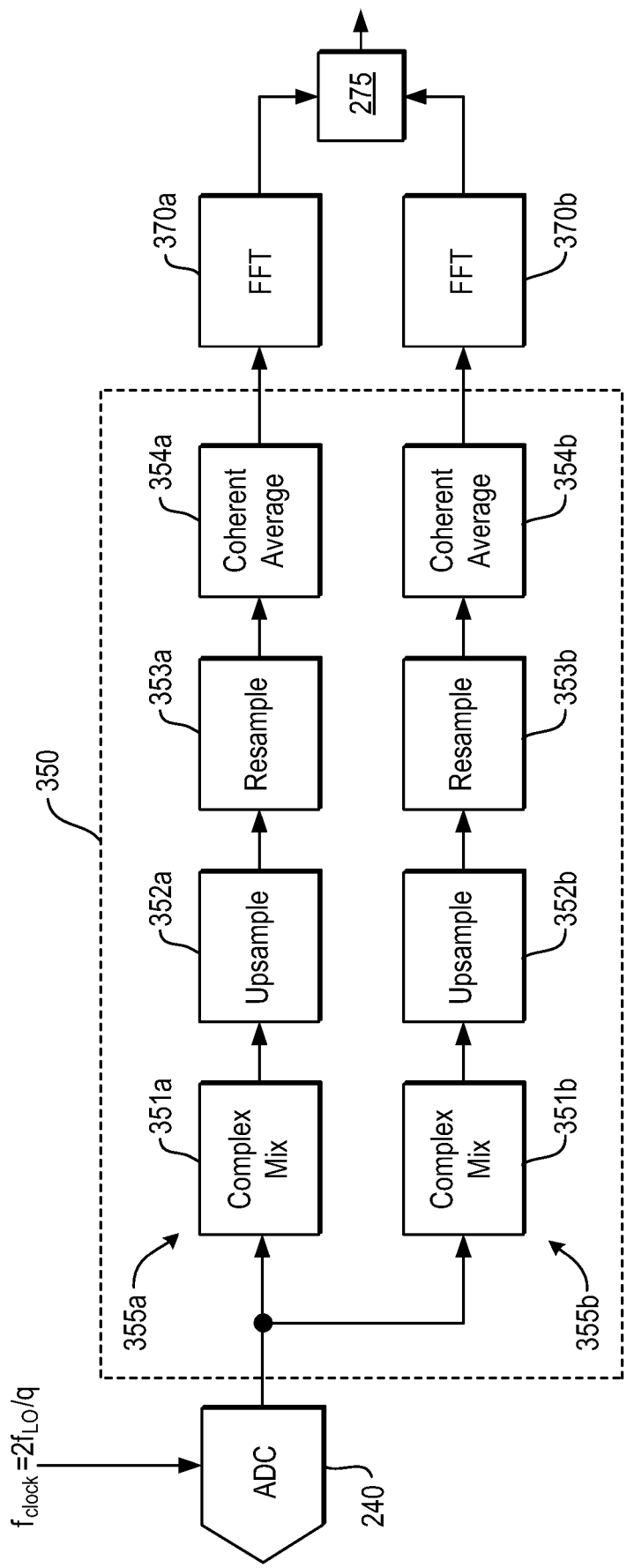
FIG. 3 is a simplified block diagram of a descrambling module of a DNA, according to a representative embodiment.
Figure 4:
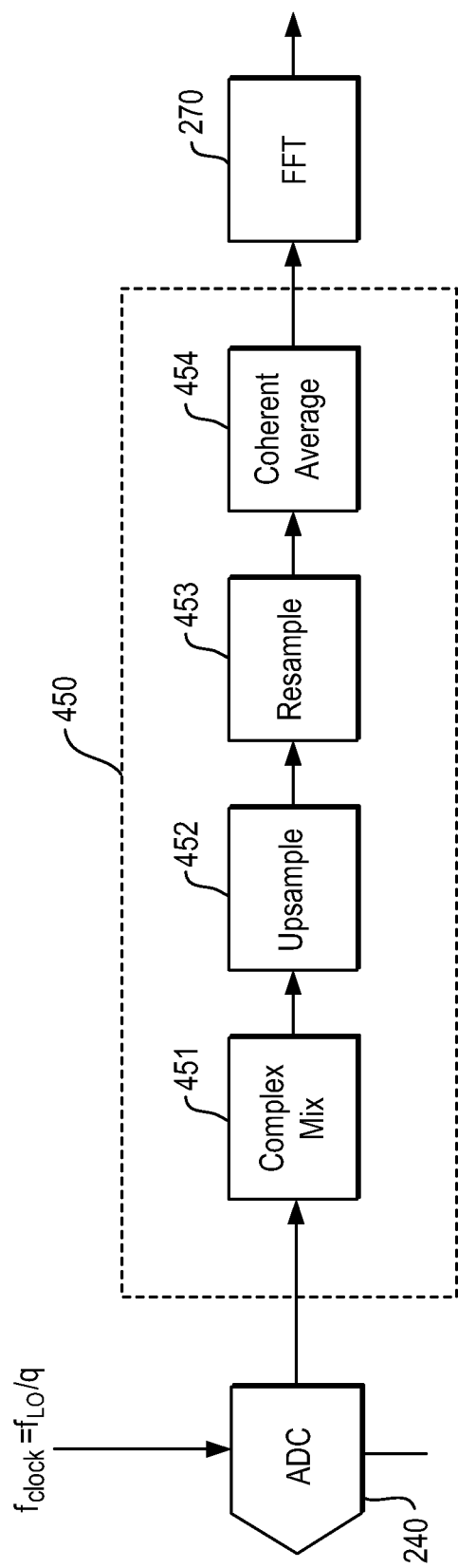
FIG. 4 is a simplified block diagram of a descrambling module of a DNA, according to a representative embodiment.

FIGS. 3 and 4 are simplified block diagrams of the descrambling module of a DNA, according to representative embodiments. FIG. 3 shows descrambling module 350, which provides a parallel processing path solution, and FIG. 4 shows descrambling module 450, which provides a single processing path solution.

Referring to FIG. 3, the descrambling module 350 is an illustrative configuration of the descrambling module 250 shown in FIG. 2, and is connected between the ADC 240 and the FFT module 270. As mentioned above, the output of the descrambling module 350 may be connected to the capture memory 260 instead of, or in addition to, the FFT module 270, without departing from the scope of the present teachings. The descrambling module 350 receives the digitized IF signal from the ADC 240, and descrambles the digitized IF signal in the time domain (with time domain signal processing) to output a descrambled IF signal. In the depicted embodiment, the sampling clock ($f_{clock}$) of the ADC 240 is set to appropriately sample the IF period, e.g., $f_{clock}=2f_{LO}/q$, where $f_{LO}$ is the frequency of the LO signal output by the LO signal generator 220 and q is the number of bits in the LO pattern. Because $f_{clock}=2f_{LO}/q$, no compensation of the digitized IF signal is required (i.e., no resampling to provide another sampling rate) for the parallel processing path solution. In an alternative embodiment, the sampling clock of the ADC 240 may not appropriately sample the IF period, e.g., $f_{clock} \neq 2f_{LO}/q$, in which case a resampling module (not shown) is additionally included at the front end of the descrambling module 350 for digitally resampling the digitized IF signal to provide the appropriate sample period.

In the depicted embodiment, the descrambling module 350 includes two separate and parallel processing paths, first path 355a and second path 355b. The first and second paths 355a and 355b are substantially the same as one another, except that the second path 355b is shifted in frequency by s*n from the first path 355a, where n is the number of bits in the RF pattern and s is an oversampling ratio, as discussed further below. The first path 355a includes a first complex mixing module 351a, a first upsampling module 352a, a first resampling module 353a and a first coherent averaging module 354a, and the second path 355b includes a second complex mixing module 351b, a second upsampling module 352b, a second resampling module 353b and a second coherent averaging module 354b. The digitized IF signal is split such that the first path 355a receives a first portion of the IF signal and the second path 355b receives a second portion of the IF signal. Generally, the second path 355b may descramble the second portion of the IF signal substantially simultaneously with the first path 355a descrambling the first portion of the IF signal.

The first complex mixing module 351a performs a first complex mixing operation on the first portion of the IF signal and the second complex mixing module 351b performs a second complex mixing operation on the second portion of the IF signal. For example, the first complex mixing module 351a digitally multiplies the first portion of the IF signal by $e^{-j2\pi kn/N}$ and the second complex mixing module 351b digitally multiplies the second portion of the IF signal by $e^{-j2\pi n(k+N/2)/N}$, which is essentially equivalent to multiplying the first path 355a by alternating positive negative 1's (i.e., 1, −1, 1, −1, . . . . ). The operations of the first and second complex mixing modules 351a and 351b effectively rotate the spectrum of the second portion of the IF signal by s*n, as mentioned above, resulting in deficiencies in the first path 355a being compensated for by the second path 355b, and vice versa.

The first and second upsampling modules 352a and 352b perform upsampling operations on the samples at upsampling rate, providing additional zero values to the first and second samples per period of the waveform of the first and second portions of the IF signal, respectively. This upsampling operation may also be referred to as "zero insertion." The upsampling rate (and the number of additional zero value samples required to provide the upsampling rate) is determined generally by the number of LO comb lines used in the measurement. For example, an upsampling factor M may be based on the number of LO comb lines that contribute to the measurement. For example, if the frequency bins of interest are the mixing products of an LO with eight comb lines, then M is required to be equal to 8, as described in more detail below. Notably, the upsampling operations performed by the first and second upsampling modules 352a and 352b allow the spectrum of the first and second portions of the IF signal to be recreated with the RF comb lines in their original order and positions (e.g., the predetermined first order of the first comb lines 215). However, the upsampling brings with it the other mixing products, which may not be desirable. Accordingly, resampling and coherent averaging operation is performed to retain only the RF comb lines, and to eliminate the other mixing products.

The first and second resampling modules 353a and 353b perform first and second resampling operations on the first and second upsampled samples, respectively, to further adjust the upsampling rate in order to provide an integer number of samples for each period of the IF waveform of the first and second portions of the IF signal. The required adjustments to the upsampling rate by the first and second resampling modules 353a and 353b are typically relatively small. Generally, a whole period of the resampled waveform should result in a total number of samples that is divisible by another factor, such as $(sq+N_{off})$, discussed below. The output of the first and second upsampling modules 352a and 352b yield a waveform that has M*s*n samples, which is not necessarily divisible by $(sq+N_{off})$. The purpose of the first and second resampling modules 353a and 353b is therefore to finely adjust the output sample rates, respectively, such that the M*s*n samples are evenly divisible by $(sq+N_{off})$. As another example, if there are $N_U$ samples per period after upsampling by the first and second upsampling modules 352a and 352b, the first and second resampling modules 353a and 353b will adjust the sampling rate to provide a total of $N_R=R*N_U$ samples in one period, where $N_U$ is the upsampled record length, $N_R$ is the resampled record length, and R is the resampling ratio. $N_R$ will be divisible by $(sq+N_{off})$ for appropriately chosen values of R. Thus, in various embodiments, the outputs of the first and second resampling modules 353a and 353b are integer multiples of a predetermined record length of the first and second coherent averaging modules 354a and 354b, respectively.

The first and second coherent averaging modules 354a and 354b perform first and second coherent averaging operations on the first and second resampled samples, respectively, in order to accumulate samples in corresponding first memory and second memory, respectively, having the predetermined record length. Generally, the coherent averaging operation may include time averaging x sample vectors of the first and second resampled samples to yield averaged sample vector (where x is an integer greater than or equal to 2). This results in x samples in one period of the IF waveform of each of the first and second portions of the IF signal. The output of each of the first and second resampling modules 353a and 353b is added by the first and second coherent averaging modules 354a and 354b to a corresponding preset value in a particular record of the memory and stored back to that location, as discussed in more detail below. The frequency bins of interest are then present in the record and in the proper order (i.e., the predetermined first order).

First and second FFT operations are then performed by the first and second FFT modules 270a and 270b on the records in the memories of the first and second coherent averaging modules 354a and 354b, respectively. The first and second FFT modules 270a and 270b thus provide descrambled first and second portions of the IF signal, respectively. Select FFTs from the first and second FFT modules 270a and 270b are then stitched together by stitching module 275 to provide a consolidated IF waveform of the IF signal in the frequency domain. The stitching module 275 effectively extracts measurement results from the outputs of the first and second FFT modules 270a and 270b, and selects preferred frequency bins of interest accordingly. That is, the stitching operation keeps the frequency bins of interest from the first and second paths 355a and 355b, respectively, that originated in the first IF zone, e.g., discussed below with reference to FIG. 6.

Referring to FIG. 4, the descrambling module 450 is another illustrative configuration of the descrambling module 250 shown in FIG. 2, and is connected between the ADC 240 and the FFT module 270. As mentioned above, the output of the descrambling module 450 may be connected to the capture memory 260 instead of, or in addition to, the FFT module 270, without departing from the scope of the present teachings. The various operations discussed with reference to the descrambling module 450 as described in more detail, below.

The descrambling module 450 receives the digitized IF signal from the ADC 240, and descrambles the digitized IF signal in the time domain (with time domain signal processing) to output a descrambled IF signal. In the depicted embodiment, the sampling clock ($f_{clock}$) of the ADC 240 is set to sample the IF period at $f_{clock}=f_{LO}/q$, where $f_{LO}$ is the frequency of the LO signal output by the LO signal generator 220 and q is the number of bits in the LO pattern. Therefore, no compensation (i.e., resampling) of the digitized IF signal is required for the single processing path solution. In an alternative embodiment, the sampling clock of the ADC 240 may not appropriately sample the IF period, e.g., $f_{clock} \neq f_{LO}/q$, in which case a resampling module (not shown) is additionally included at the front end of the descrambling module 450 for digitally resampling the digitized IF signal to provide the appropriate sample period.

In the depicted embodiment, the descrambling module 450 includes complex mixing module 451, upsampling module 452, resampling module 453 and coherent averaging module 454. The complex mixing module 451 performs a complex mixing operation on the digitized IF signal to provide complex samples having real and imaginary components in each period of the digitized IF signal. For example, the complex mixing module 451 may perform digital multiplication by cosine and sine at some frequency to provide the real and imaginary components. For example, the complex mixing module 451 digitally multiplies the frequency by $\cos(2\pi nk/N)$ and $\sin(2\pi nk/N)$. The complex mixing module 451 thus rotates the spectrum, effectively creating two paths with different behaviors, where deficiencies in one path may be compensated for by the other path.

The upsampling module 452 performs an upsampling operation on the samples at an upsampling rate, providing additional zero value samples per period of the waveform of the digitized IF signal, as discussed above. The upsampling operation performed by the upsampling module 452 allows the spectrum of the IF signal to be recreated with the RF comb lines in their original order and positions (e.g., the predetermined first order of the first comb lines 215), although with additional mixing products that are removed by the subsequent processing steps.

The resampling module 453 performs a resampling operation on the upsampled samples to further adjust the upsampling rate in order to provide an integer number of samples for each period of the IF waveform. The required adjustment to the upsampling rate by the resampling module 453 is typically relatively small. For example, if there are $N_U$ samples per period of the IF waveform output by the upsampling module 452, the resampling module 453 may multiply by R to provide $R \times N_U$ samples, where The product $R \times N_U$ is evenly divisible by another factor, such as $sq_+ N_{off}$ to give an integer number of averages per period of the IF waveform, as discussed below. That is, in various embodiments, the output of the resampling module 453 must be an integer multiple of a predetermined record length of the coherent averaging module 454.

The coherent averaging module 454 performs a coherent averaging operation on the resampled sample in order to accumulate samples in a corresponding memory having the predetermined record length. The coherent averaging operation may include time averaging n sample vectors of the samples to yield an averaged sample vector (where n is an integer greater than or equal to 2). This results in n samples in one period of the IF waveform. The output of the resampling module 453 is added to a preset value in a particular record of the memory and stored back to that location. The frequency bins of interest are then present in the record and in the proper order (i.e., the predetermined first order). The FFT operation is then performed by the FFT module 270 on the record in the memory of the coherent averaging module 454 to provide frequency domain samples of the frequency bins of interest corresponding to the digitized IF signal. In alternative embodiments, the FFT module 270 may receive the frequency bins of interest directly from the descrambling module 450 to provide the frequency domain samples corresponding to the digitized IF signal, without departing from the scope of the present teachings.

To further facilitate understanding of the scrambling of comb lines that occurs during the mixing operation of the mixer 230 and the descrambling of the comb lines that occurs during the descrambling operation the descrambling module 250, definitions of various quantities and frequency relationships are provided below. The LO frequency $f_{LO}$ is provided by Equation (1), in which $f_{RF}$ is the frequency of the RF signal output by the DUT 205, q is the number of bits in the LO pattern, s is the oversampling ratio (number of samples/bit), and $N_{off}$ is an offset to ensure that numerator and denominator have no common factors.

$$f_{LO} = \frac{(f_{RF})(sq)}{sq + N_{off}} \quad (1)$$

$N_{off}$ is related to the rate of precession between the two patterns. Larger values of $N_{off}$ imply a larger frequency offset between the LO and RF clocks. Here, the quantities $sq+N_{off}$ and sq are mutually prime. That is, the lowest common multiple (LCM) of $(sq+N_{off}, sq)$ is $(sq+N_{off})*(sq)$. This means that the period of the IF waveform of the IF signal, which is the product of the RF and LO waveforms, is of maximal length, ensuring that energy from the RF pattern of the RF signal will fall at unique frequencies in the IF signal after the mixing operation by the mixer 230.

The repetition rate of the IF waveform, indicated by the frequency $f_{IF}$ of the IF signal, is provided by Equation (2), in which n is the number of bits in the RF pattern, q is the number of bits in the LO pattern, and s is the oversampling ratio, and alias free acquisition occurs at s/2 times the clock rate:

$$f_{IF} = \frac{f_{LO}}{sqn} \quad (2)$$

Figure 5:
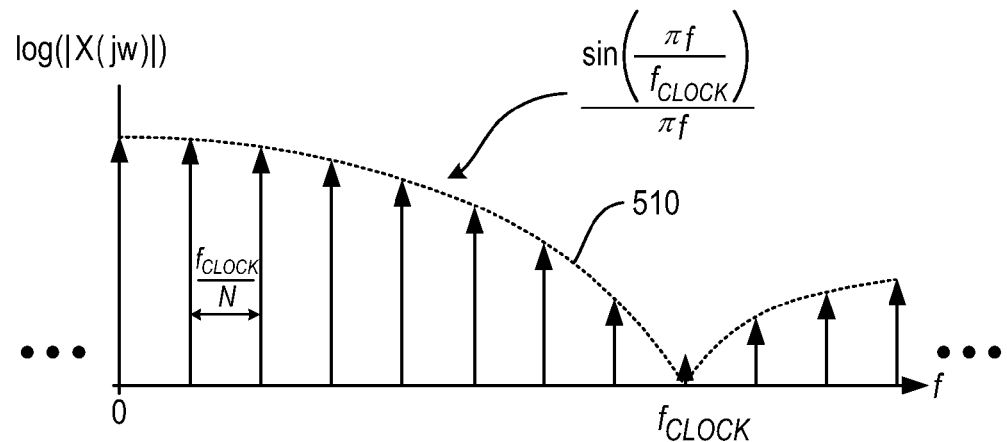
FIG. 5 is a Fourier transform providing a representative power spectrum of a pseudo-random bit sequence (PRBS) clocked at a sampling rate of a DNA.

For purposes of explanation, the DNA 200 may be visualized using the frequency domain, as shown in FIG. 5, for example. In particular, FIG. 5 shows a Fourier transform providing a representative power spectrum 510 of a pseudo-random bit sequence (PRBS) clocked at a sampling rate $f_{clock}$ with a period of N bits. Such sequences are commonly used as digital patterns for the RF and LO clocks. In general, the RF and LO patterns are chosen as sequences with an autocorrelation function that closely approximates a delta function. The FFT of such an autocorrelation function has a near flat, comb-like frequency response. The duration of the pattern determines its repetition rate, setting the spacing between comb teeth in the frequency domain. The zero order hold of the pattern generator (e.g., LO signal generator 220 imposes a sinc response on the frequency comb, where the first null of the sinc occurs at the pattern clock frequency $f_{pattern}$.

Figure 6:
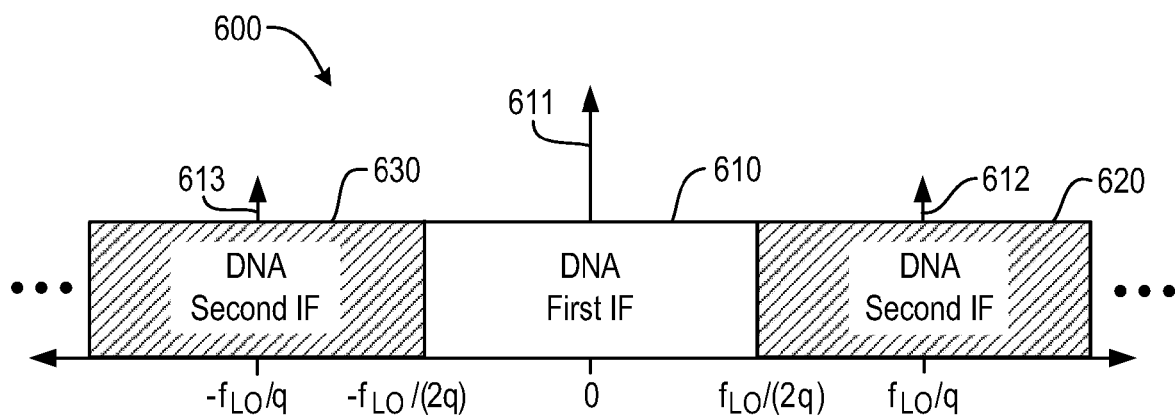
FIG. 6 is a frequency domain view of IF zones of a DNA, according to a representative embodiment.

FIG. 6 shows representative IF mixing products of the RF signal and the LO signal in the IF signal output by the mixer 230 in the frequency domain. As shown in FIG. 6, the IF mixing products include multiple IF zones, indicated by representative first IF zone 610, second IF zone 620 and second IF zone 630. The first and second IF zones 610, 620 and 630 is centered about a corresponding first, second and third LO comb lines 611, 612 and 613 from the LO signal, respectively. Also, each of the first and second IF zones 610, 620 and 630 is a near perfect frequency compressed copy of the RF pattern. However, the original RF comb lines appear out of order in the IF signal, as discussed above. The first IF zone 610, in particular, is centered about zero (DC), extending from $-f_{LO}/(2q)$ to $+f_{LO}/(2q)$, and contains mixing products from the closest RF comb line to any LO comb line. That is, the first IF zone 610 includes $sn/2$ unique mixing products or $s*n$ total products including conjugate symmetry about DC. A progression of the first and second IF zones 610-630 are largely spectral replicas.

Figure 7:
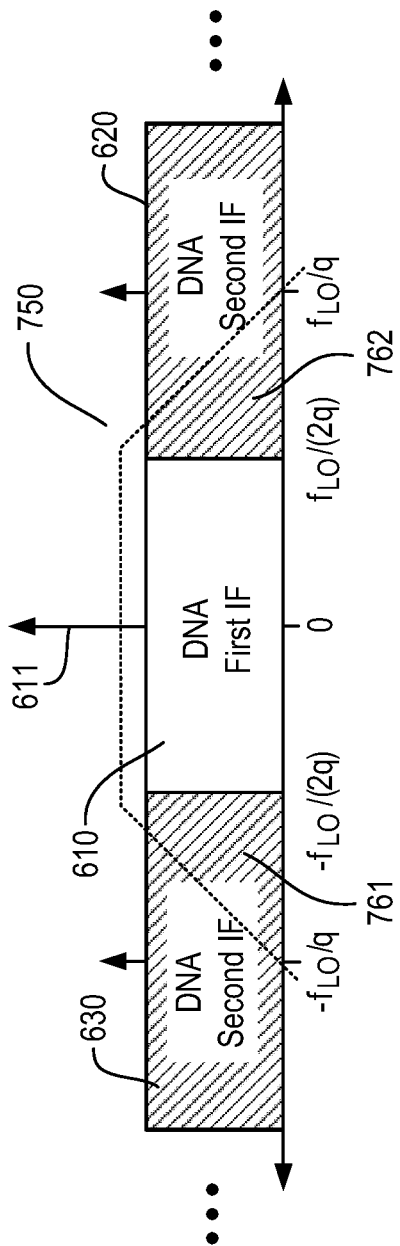
FIG. 7 is a frequency domain view of IF zones of a DNA with analog IF filter response, according to a representative embodiment.

The broadband IF signal is lowpass filtered by the LPF 233, and then digitized by the ADC 240, as mentioned above. FIG. 7 shows the broadband IF signal composed of the first and second IF zones 610-630 with analog filter response 750 of the LPF 233 superimposed. Typically, it is the lowest IF zone, centered about DC (i.e., the first IF zone 610), that is digitized by the ADC 240. In the depicted example, the analog filter response 750 extends from the centers of the adjacent second IF zones 620 and 630 (i.e., $-f_{LO}/q$ to $f_{LO}/q$). The analog filter response 750 includes partially attenuated portions 761 and 762, indicated by cross-hatching, which occur outside the first IF zone 610.

Figure 8A:
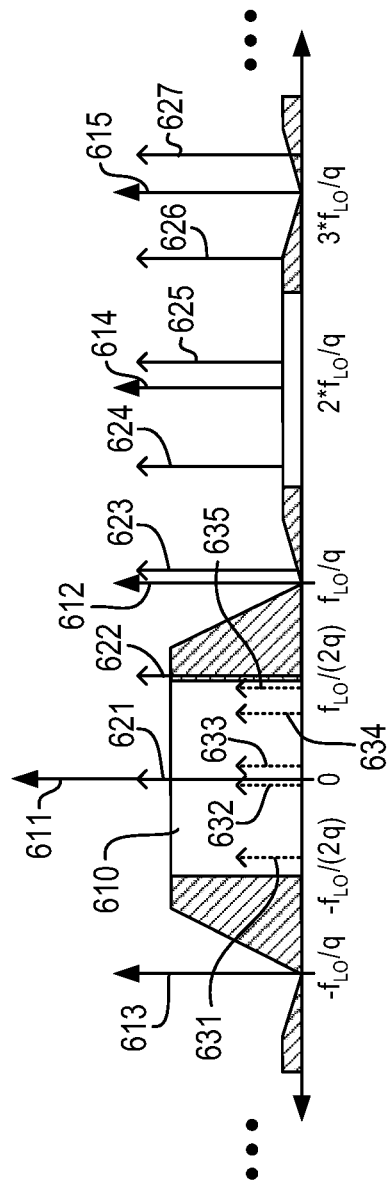
FIG. 8A is a frequency domain view of a filtered IF signal of a DNA, according to a representative embodiment.

FIG. 8A illustrates the filtered IF signal before digitization, with representative LO comb lines 611-615 from the LO pattern, representative RF comb lines 621-627 from the RF pattern, and representative (approximated) aliased mixing products 631-635 in the first IF zone 610. The aliased mixing products 631-635 in the first IF zone 610 (which generally correspond to the second comb lines 235 of the IF signal) are scrambled (i.e., in a second order), such that they are in a different order than the corresponding RF comb lines 623-627 (i.e., a predetermined first order).

To explain the process by which the aliased mixing products 631-635 are scrambled, the above frequencies are restated in terms of s, q, n and $N_{off}$. In an embodiment, implementation of the descrambling (reconstruction) algorithm assumes an input sample rate of $2*f_{LO}/q$. This sample rate may be accomplished by the ADC 240 sampling at this rate (i.e., $f_{clock} 2*f_{LO}/q$, as shown in FIG. 3), or by employing arbitrary resampling techniques downstream of the ADC 240 clocked at a different rate, prior to the descrambling module 250. The choice of $2*f_{LO}/q$ results in an IF period of length $2*s*n$ samples, where the Nyquist frequency is $s*n$ times the IF frequency $f_{IF}$.

Figure 8B:
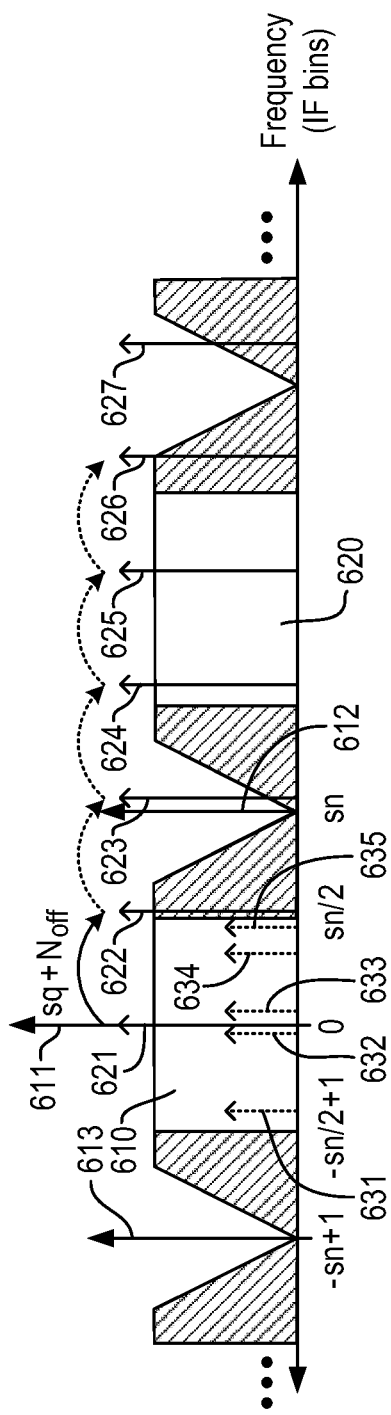
FIG. 8B is a frequency domain view of spectral line frequencies of the filtered IF signal of a DNA, according to a representative embodiment.

FIG. 8B shows frequencies of comb lines with respect to the IF frequency $f_{IF}$. Each IF contains exactly $s*n$ evenly spaced mixing products, of which $s*n/2$ are unique. There are $sn/2$ mixing products in the real part of the spectrum, and since the IF waveform is real valued, there are $sn/2$ mixing products with complex conjugate symmetry. Each LO comb line is separated by $s*n$ IF bins for a typical (yes-even) pattern. The first LO comb line (e.g., LO comb line 611) is at DC, the next LO comb line (e.g., LO comb line 612) is at $f_{LO}/q$ (which is the same as $s*n*f_{IF}$), and so on. Accordingly, Equation (3) follows from Equations (1) and (2):

$$\frac{f_{LO}}{q} = f_{IF}(sn) \quad (3)$$

There are sn multiples of the IF frequency $f_{IF}$ between every set of adjacent LO comb lines. Since the IF waveform is digitized with an integer number of samples per IF period, it follows that the discrete Fourier transform (DFT) of the IF waveform will have $s*n$ frequency bins per IF zone. For the illustrative input sample rate of $2*f_{LO}/q$, there are $2*s*n$ samples per IF period.

The RF comb lines 621-627 are separated from one another by $sq+N_{off}$ bins for a typical (yes-even) pattern. Thus, the first RF comb line 621 falls at DC, the second RF comb line 622 falls at $f_{RF}/n$ (which is the same as $sq+N_{off}*f_{IF}$), and so on. Equation (4) therefore may be determined from Equations (1) and (2):

$$\frac{f_{RF}}{n} = f_{IF}(sq + N_{off}) \quad (4)$$

The mixing product of each given RF comb line with the nearest LO comb line will lie in the first IF zone 610 (from DC to $\pm sn/2$ frequency bins). Equation (5) provides a simple expression demonstrating the effect of this, where i is the index of the RF comb line and k is the frequency bin to which that RF comb line aliases in the first IF zone 610:

$$k_{RF\_aliased} = \mathrm{mod}(i(sq + N_{off}), sn) - \frac{sn}{2} \quad (5)$$

Accordingly, the mixing operation is effectively just aliasing. An RF comb line at a frequency higher than the IF frequency $f_{IF}$ is aliased back to the first IF zone 610 by the nearest LO comb line, as indicated by the aliased mixing products 631-635. Accordingly, the descrambling module 250 is configured to reconstruct the non-aliased version of the RF comb lines (as descrambled IF comb lines) within the constraints of the multi-tone stimulus/response DNA 200.

Generally speaking, the aliasing introduced by the mixing operation of the mixer 230 can be undone (descrambled) using a combination of upsampling and coherent averaging, e.g., implemented by the descrambling module 250. For purposes of illustration, a descrambling process will be described with reference to the embodiment of the descrambling module 250 depicted in FIG. 3 (i.e., descrambling module 350), although the general principles may be applied to other configurations of the descrambling module 250 (e.g., descrambling module 450), without departing from the scope of the present teachings.

Figure 9:
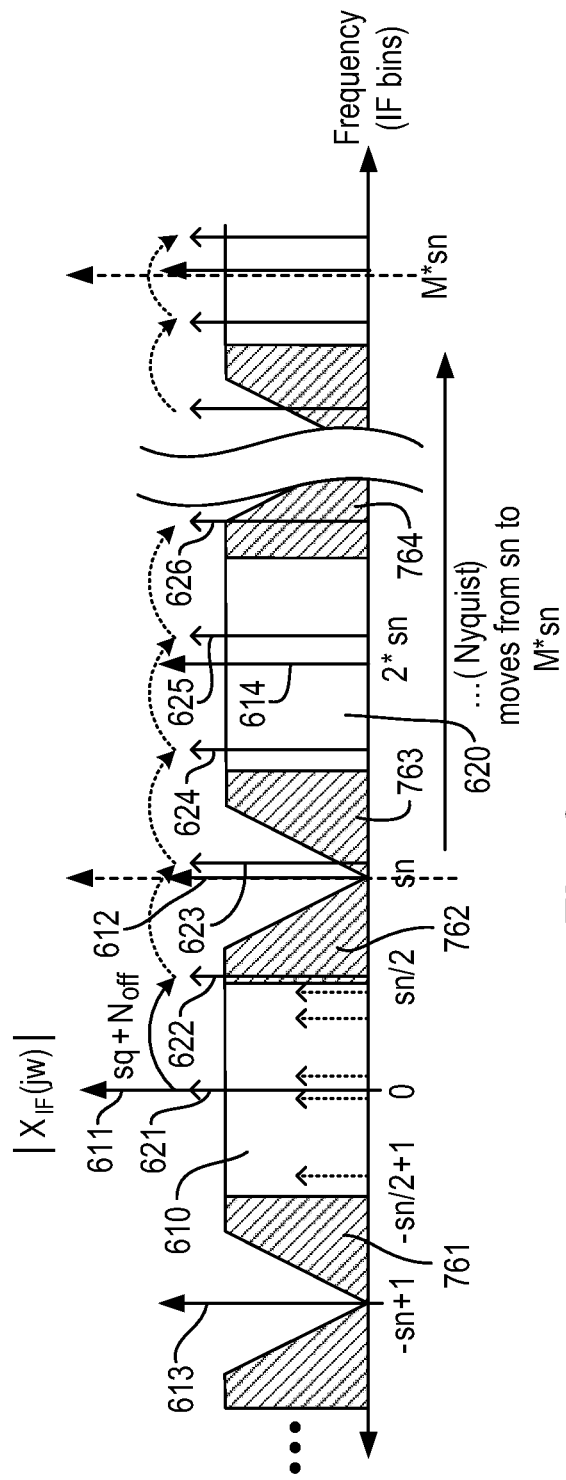
FIG. 9 is a frequency domain view of upsampled spectral line frequencies of the filtered IF signal within Nyquist, according to a representative embodiment.

FIG. 9 shows frequencies of comb lines following the process of upsampling by zero insertion by first and second upsampling module 352a and 352b (e.g., following complex mixing by complex mixing modules 351a and 351b). The upsampling process moves Nyquist from $s*n$ to $M*s*n$, and thereby creates spectral copies of the first IF zone 610, centered at multiples of $2*s*n*f_{IF}$, within Nyquist. Therefore, a digital version of the wideband IF may be recreated from a filtered and digitized copy of the first IF zone 610.

After upsampling, the aliased RF comb lines are once again in frequency order, arranged at evenly spaced intervals of $sq+N_{off}$ frequency bins. The upsampling process thus has the effect duplicating the spectrum in the frequency domain, such that the RF comb lines that were aliased are still aliased, but now there are non-aliased copies as well. The coherent averaging, discussed below, effectively acts as a selective filter that retains the original RF comb lines. For the descrambling module 350, the input sample rate (e.g., $f_{clock}$ of the ADC 240) is $2*f_{LO}/q$, or $2*s*n$ total IF samples so that the indexing works correctly. Notably, some RF comb lines (e.g., RF comb lines 623 and 626) in the progression fall within partially attenuated portions 763 and 764 (cross-hatched) of the second IF zone 620. Thus, in order to properly recover all RF comb lines, the two separate and parallel first and second paths 355a and 355b may be used, where the second path 355b is shifted in frequency by $s*n$ from the first path 355a, as discussed above. Full reconstruction requires stitching together the records from the first path 355a and the second path 355b by the stitching module 375 during subsequent processing, and at a much lower data rate.

An upsampling factor M is determined based on the number of RF comb lines in the measurement span (plus some padding to account for digital filtering transition bands). Stated differently, the upsampling factor M is the number of LO comb lines that contribute to the measurement.

As mentioned above, the upsampling performed by the first and second upsampling modules 352a and 352b allows the spectrum to be recreated with the RF comb lines in their original order and positions. However, the upsampling brings with it the other mixing products. Accordingly, a coherent averaging operation is performed by the first and second coherent averaging modules 354a and 354b (e.g., following resampling operations by the first and second resampling modules 353a and 353b, as needed) to retain only the RF comb lines, and to eliminate the other mixing products.

The process of coherent averaging allows selective filtering and retention of every Kth frequency in a record. Generally, the K segments are averaged, and each of the K segments contains L samples. The DFT of this averaged record is mathematically equivalent to the DFT of the longer K*L length record, where every Kth bin (starting at DC) is retained.

For example, coherent averaging by sq+N retains only the frequencies of interest (the RF comb lines) from the upsampled record, e.g., corresponding to DC and every RF comb line available, in order. The upsampled record length $N_U$ is provided by Equation (6), in which M is the upsampling factor, s is the number of samples per bit, and n is the length of the RF pattern in bits.

$$N_U = 2Msn \quad (6)$$

To apply coherent averaging, the upsampled record length $N_U$ must be divisible by sq+$N_{off}$. More particularly, K is the number of segments (of L samples each) which are averaged together, and is chosen to be equal to sq+$N_{off}$, as indicated by Equation (7).

$$K = sq + N_{off} \quad (7)$$

L is the segment length, and is roughly equivalent to the number of RF comb lines of interest (plus some padding). The upsampling factor M may be chosen such that L arrives at the next closest power of two, which facilitates subsequent FFT processing, e.g., by FFT module 270. Equation (8) provides the value of the segment length L, where d is the number of additional samples in the record required to make the segment length L an integer.

$$L = \frac{2Msn + d}{sq + N_{off}} \quad (8)$$

Generally, the upsampled record length $N_U$ is not evenly divisible by sq+$N_{off}$. Using principles of resampling, the number of samples in one period may be decreased (or increased), using the resampling operations by the first and second resampling modules 353a and 353b, to be divisible by sq+$N_{off}$ to enable the subsequent coherent averaging operation. The number of additional samples d in Equation (8) may be given by Equation (9):

$$d = rem(2Msn, sq + N_{off}) \quad (9)$$

The resampling ratio R required to achieve d fewer samples is given by Equation (10), where the relationships are intended to be illustrative:

$$R = \frac{2Msn - d}{2Msn} \quad (10)$$

Notably, the resampling ratio R may be further constrained so that the output record length is a power of two samples. This facilitates FFT processing, e.g., by the first and second FFT modules 270a and 270b.

FIG. 10A illustrates a time domain IF record after upsampling by the first and second upsampling modules 352a and 352b. FIG. 10B illustrates the same time domain IF record after resampling by the first and second resampling modules 353a and 353b.

At most, eight output samples (shown in FIG. 10B) need to be binned and averaged for every one input sample (shown in FIG. 10A). Furthermore, having a power of two taps results in a more efficient map into digital hardware. The upsampling factor M is one half the number of LO comb lines used to mix down the RF comb lines of interest because the two path approach (first and second paths 355a and 355b) already oversamples by two. For purposes of illustration, the single input samples are indicated at X[i], X[i+N] and X[i+2N], etc., and the corresponding sets of eight output samples likewise begin at X[i], X[i+N] and X[i+2N], etc. The single input samples are separated by M-1 zeros, while the sets of eight output samples are separated by M-8 zeros. It may be simpler to design hardware that always upsamples by eight, because fewer than 16 LO comb lines are used for only very focused patterns (and DSP will already be very fast). If the upsampling factor M is less than eight, then the first and second resampling modules 353a and 353b need to do filtering, and output is at a slower rate, which presents a more complex case. However, an upsampling factor M that is equal to one may be a relatively simple case to support.

As discussed above, some RF comb lines (e.g., RF comb lines 723 and 726) in the progression fall within partially attenuated portions (e.g., partially attenuated portions 763 and 764) of the second IF zone 620. The two separate and parallel first and second paths 355a and 355b shown in FIG. 3 are used to properly recover all RF comb lines, i.e., including those RF comb lines falling within the partially attenuated portions 763 and 764. As described above, the second path 355b is shifted in frequency by s*n from the first path 355a. The shift requires complex multiplication by the first and second complex mixing modules 351a and 351b to achieve frequency rotation. To support narrow spans, both the first and second paths 355a and 355b may require a preceding complex multiplication (rotation), regardless.

FIG. 11A is substantially the same as FIG. 9, and for purposes of illustration, shows frequencies of comb lines following the process of upsampling by zero insertion by the first upsampling module 352a of the first path 355a. In comparison, FIG. 11B shows frequencies of comb lines following the process of upsampling by zero insertion by the second upsampling module 352b of the second path 355b after having been circularly rotated by s*n (e.g., by the second complex mixing module 351b). Referring to FIGS. 11A and 11B, it can be seen that the RF comb lines 623 and 626, which fall within the corrupted part of the spectrum in the first path 355a (e.g., partially attenuated portions 763 and 764), fall within the pristine portion of the spectrum in the second path 355b. Likewise, the RF comb lines 624 and 625, which fall within the corrupted part of the spectrum in the second path 355b (e.g., partially attenuated portions 764 and 765), fall within the pristine portion of the spectrum in the first path 355a. Accordingly, after the coherent averaging performed by the first and second coherent averaging modules 354a and 354b, the DFT of the record from the first path 355a will include approximately half of the pristine RF comb lines, and the DFT of the record from the second path 355b will include the remaining pristine RF comb lines.

The final reconstruction of the original RF comb lines (e.g., first comb lines 215) requires stitching together the appropriate bins from each DFT by the stitching module 265, the manner of which would be apparent to one of ordinary skill in the art. Significantly, the stitching operation is performed after the significant data reduction of the preceding steps, further simplifying the operation.

As mentioned above, according to the various embodiments, the number of processing samples is proportional to the number of measurement points in the frequency span of the network analyzer measurement in the time domain, instead of being proportional to the inverse of resolution bandwidth in the frequency domain, resulting in a reduction in processing time by about 10 times to about 1000 times. Generally, the frequency span is defined by f_start to f_end, where f_start and f_end are the starting and ending frequencies respectively. The increased measurement speed translates into lower power measurements, as the processing time drops significantly. The streaming architecture is well suited to integration with a DNA receiver on a chip, which enables better network analysis integration and commoditization of this type of measurement. Also, with double buffering, e.g., by capture memory 260, where one buffer is capturing data while an alternate buffer is read out, the streaming algorithm of the various embodiments enables measurements at (or below) the acquisition rate of DNA (e.g., trace 110 in FIG. 1, above), enabling gapless, real-time network analysis effectively at the rate of DNA acquisition.

Figure 12:
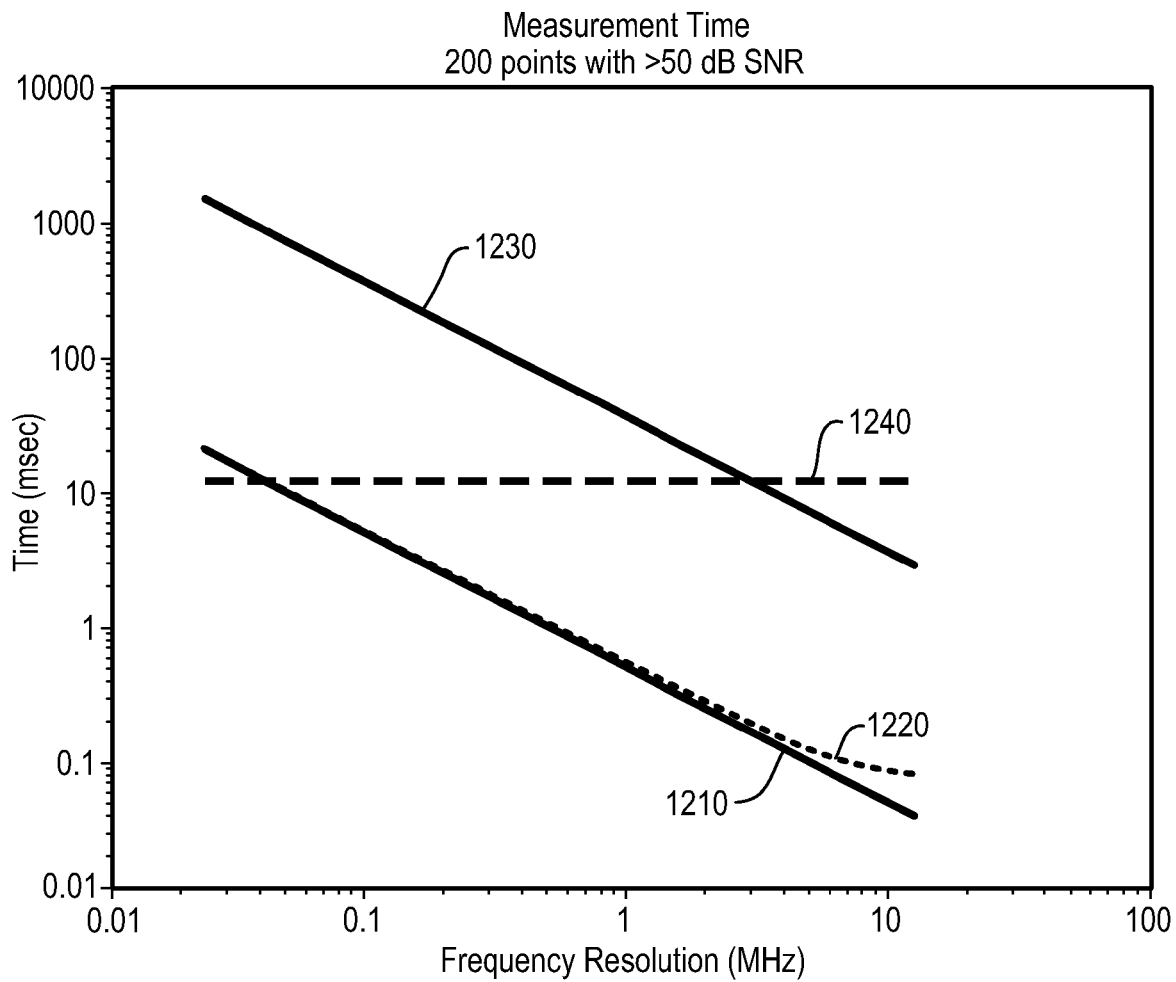
FIG. 12 is a graph depicting time versus frequency resolution of functions of a DNA, according to a representative embodiment.

Therefore, the capability of the DNA 200 is unlocked for high-throughput network analysis measurements. For, example, FIG. 12 is a graph depicting time versus frequency resolution of functions of various types of DNAs/VNA. Trace 1210 of FIG. 12 shows the theoretical fastest processing (measurement) time of a DNA, which is substantially the same as the acquisition time ($T_{acq}$), e.g., shown by trace 110 of FIG. 1. That is, the IF signal data would be processed and/or transferred as it is acquired. As would be expected, the time for IF signal data acquisition decreases as the desired frequency resolution decreases. Trace 1220 shows the processing time in accordance with a representative embodiment (e.g., as shown in FIG. 3), as described herein. The processing (measurement) may occur at substantially the same rate as or faster than the theoretical fastest processing time shown by trace 1210 (e.g., in real-time) up to the higher frequency resolutions (e.g., exceeding about 1 MHz). Even at the higher frequency resolutions, the processing time only marginally departs from theoretical fastest processing time. Trace 1230 generally shows the processing time of a conventional DNA that performs processing entirely in the frequency domain, following performance of FFTs on all sampled data of the IF signal. Trace 1240, provided for purposes of comparison, shows measurement time of a conventional, very fast vector network analyzer (VNA), which performs measurements at a constant speed, responsive to the sweep time of the LO (as opposed to the period of the IF signal waveform). As shown in FIG. 12, the representative embodiment produces processing times significantly faster than the conventional VNA, particularly as desired frequency resolution decreases.

Figure 13:
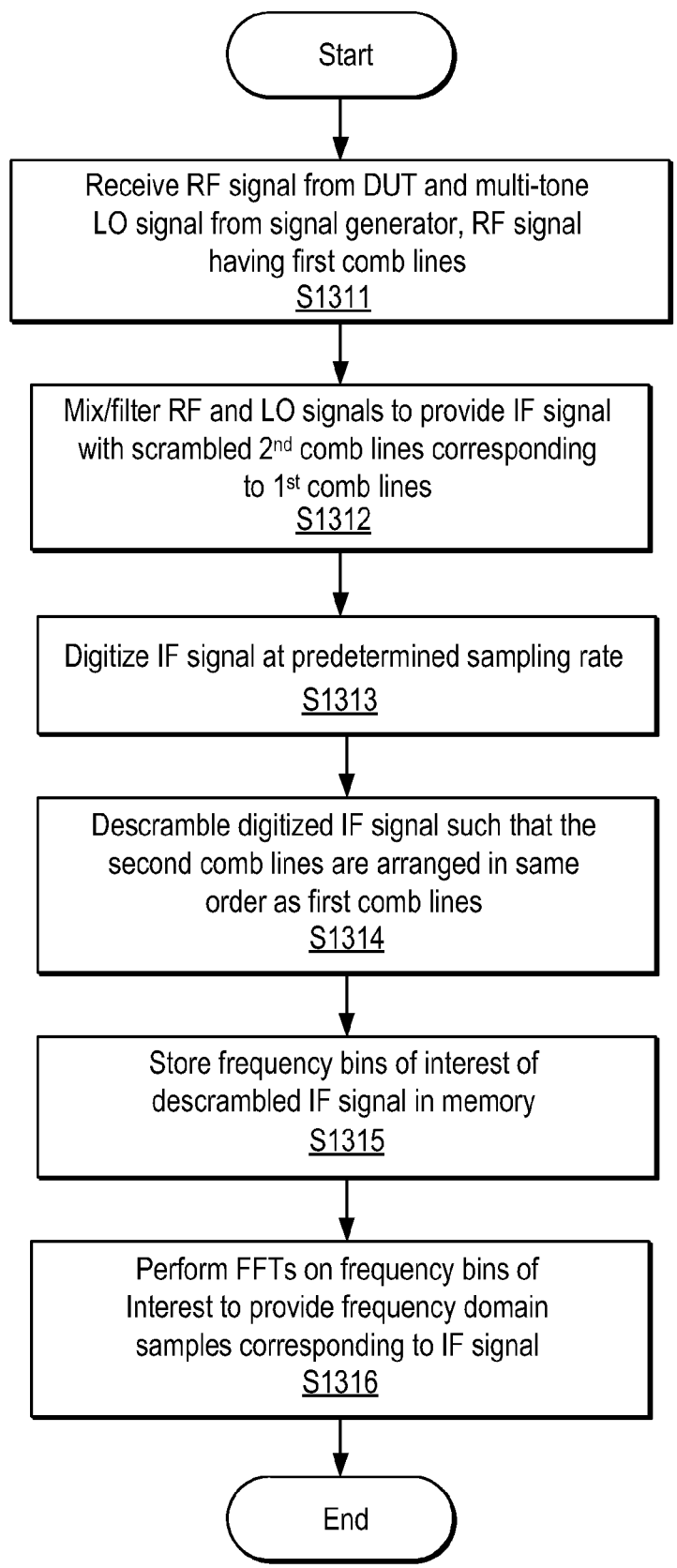
FIG. 13 is a flow diagram depicting a method of processing an RF signal output by a DUT in response to a stimulus signal from a DNA, according to a representative embodiment.
Figure 14:
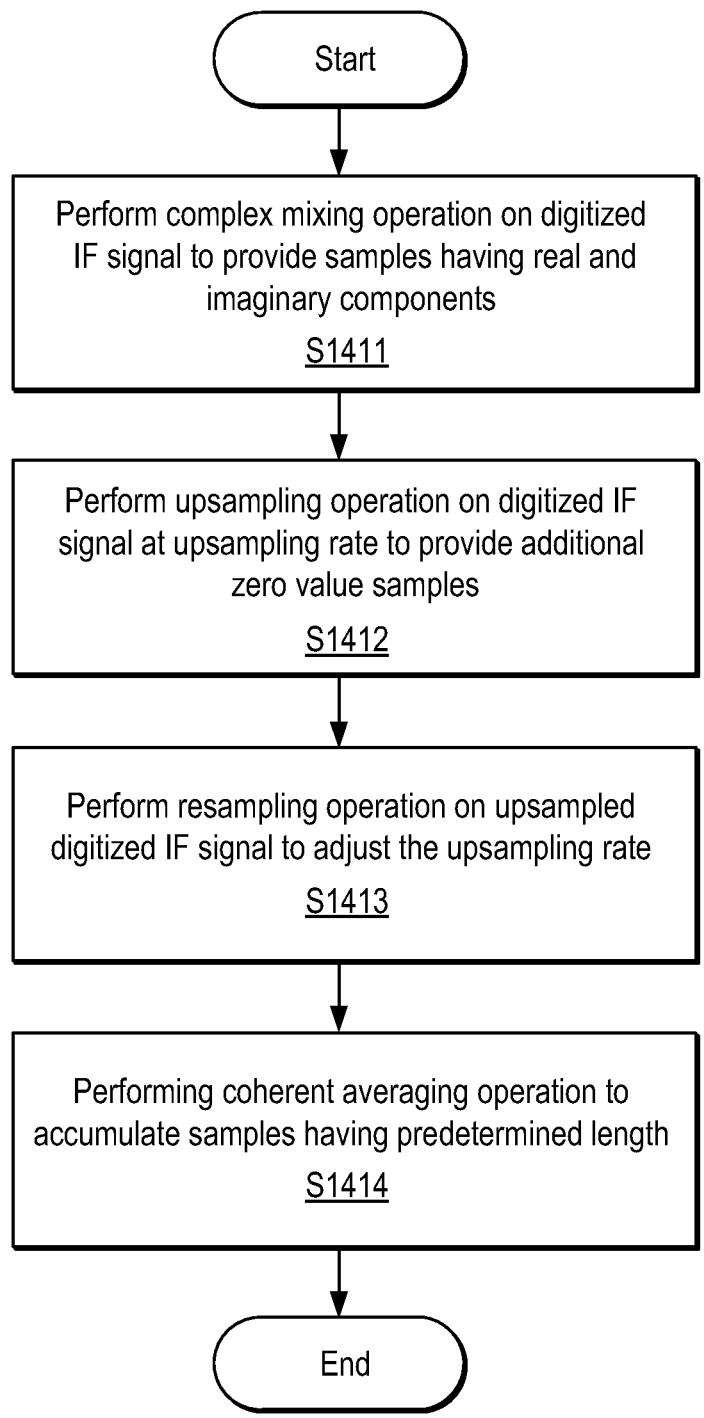
FIG. 14 is a flow diagram depicting a method of processing an RF signal output by a DUT in response to a stimulus signal from a DNA, according to a representative embodiment.

FIG. 13 is a flow diagram depicting a method of processing an RF signal output by a DUT, according to a representative embodiment, and FIG. 14 is a flow diagram depicting an illustrative method of descrambling a digitized IF signal, according to a representative embodiment.

Referring to FIG. 13, in block S1311, an RF signal is received from a DUT (e.g., DUT 205) and a multi-tone LO signal is received from an LO signal generator (e.g., LO signal generator 220). The RF signal has first comb lines that are arranged in a predetermined first order. The RF signal output by the DUT may be responsive to an RF stimulus signal from an RF signal generator (e.g., RF signal generator 210), or the RF signal may be generated by the DUT itself. The RF signal and the LO signal are mixed by a mixer (e.g., mixer 230) in block S1312 and filtered by a low pass filter (e.g., LPF 233) to provide an IF signal that has second comb lines corresponding to the first comb lines, except that the second comb lines are in a second order different from the first order. In other words, the order of the first comb lines is scrambled during the mixing operation, which provides the second comb lines.

In block S1313, the IF signal is digitized at predetermined sampling rate by an ADC (e.g., ADC 240). The sampling rate may correspond to a sampling rated needed for subsequent descrambling operations. For example, the sampling rate of the ADC may be $2f_{LO}/q$, where $f_{LO}$ is the frequency of the LO signal and q is the number of bits in the LO pattern (multi-tones) for a parallel processing path solution (e.g., FIG. 3), and may be $f_{LO}/q$ for a single processing path solution (e.g., FIG. 4). When the sampling rate of the ADC does not match the desired sampling rate, a resampling operation may be performed before the subsequent descrambling operations.

The digitized IF signal is descrambled in block S1314, such that second comb lines are arranged in same order as first comb lines. Referring to FIG. 14, which provides an illustrative descrambling method implemented by the descrambling module 450 in FIG. 4, a complex mixing operation is performed in block S1411 by a complex mixing module (e.g., complex mixing module 451) on the digitized IF signal to provide complex samples having real and imaginary components in each period of the digitized IF signal, thus rotating the spectrum and effectively creating two paths with different behaviors, where deficiencies in one path may be compensated for by the other path. For example, digital multiplication by cosine and sine may be performed at some frequency to provide the real and imaginary components.

In block S1412, an upsampling operation is performed by an upsampling module (e.g., upsampling module 452) on the complex samples at an upsampling rate, inserting zero value samples to obtain the upsampled rate. A resampling operation is performed on the upsampled complex samples in block S1413 by a resampling module (e.g., resampling module 453) to further adjust the upsampling rate. The resampled rate is intended to provide an integer number of complex samples for each period of the IF waveform in the IF signal. In block S1414, a coherent averaging operation is performed on the resampled complex samples by a coherent averaging module (e.g., coherent averaging module 454) to accumulate samples having predetermined length that include the second comb lines in the first predetermined order in frequency bins of interest, without other mixing products being present. The coherent averaging operation includes time averaging n sample vectors of the complex samples to yield an averaged sample vector (n being an integer number of complex samples of two or more in one period of the waveform).

Referring again to FIG. 13, in block S1315, the frequency bins of interest of descrambled IF signal are stored in memory (e.g., memory 260). FFTs are performed in block S1316 on the stored frequency bins of interest by an FFT module (e.g., FFT module 270) to provide frequency domain samples corresponding to the IF signal.

Although FIG. 14 is described with reference to the descrambling module 450 shown in FIG. 4, it is understood that the descrambling operation may be performed according to a method implemented by the descrambling module 350 shown in FIG. 3, without departing from the scope of the present teachings. Of course, in the embodiment of FIG. 3, parallel processing paths is used, e.g., in place of separation of real and imaginary components of the digitized IF signal, along with subsequent stitching of FFT processing results.

Embodiments described herein, including the various modules depicted in FIGS. 2, 3 and 4, and the various operations depicted in FIGS. 13 and 14, may be stored on a non-transitory computer readable medium and/or executed by one or more processing devices. A processing device may be implemented by a computer processor, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system.

The memory associated with the processing device and/or the memory 260 may be any number, type and combination of random access memory (RAM) and read-only memory (ROM), for example, and may store various types of information, such as computer programs and software algorithms executable by the processing device (and/or other components). The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are non-transitory (e.g., as compared to transitory propagating signals).

Users may interface with the processing device and/or the memory through input/output interfaces using various input device(s), such as a keyboard, key pad, a track ball, a mouse, a touch pad or touch-sensitive display, and the like, for example. Also, various information, such as the measurement times versus frequency resolution, discussed above, may be displayed on a display through display interface, which may include any type of graphical user interface (GUI). The type, number and arrangement of interfaces may vary without departing from the scope of the present teachings.

In accordance with illustrative embodiments, DNAs and methods executable by DNAs are described for measuring IF signals, for example. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A method of processing a radio frequency (RF) signal output by a device under test (DUT), the RF signal having a plurality of first comb lines in a predetermined first order, the method comprising:
   mixing and filtering the RF signal with a multi-tone local oscillator (LO) signal to provide an intermediate frequency (IF) signal having a plurality of second comb lines corresponding to the plurality of first comb lines, wherein the mixing scrambles in frequency the first comb lines of the RF signal such that the plurality of second comb lines of the IF signal are in a second order different from the predetermined first order;
   digitizing the IF signal at a predetermined sampling rate; and
   descrambling the digitized IF signal with time domain signal processing such that the plurality of second comb lines of the digitized IF signal are arranged in the predetermined first order.

2. The method of claim 1, further comprising:
   storing frequency bins of interest of the descrambled IF signal in a memory, the frequency bins of interest including the plurality of second comb lines; and
   performing fast Fourier transforms (FFTs) on the stored frequency bins of interest of the descrambled IF signal to provide frequency domain samples corresponding to the digitized IF signal.

3. The method of claim 2, wherein descrambling the digitized IF signal with the time domain signal processing comprises:
   performing a complex mixing operation on the digitized IF signal to provide complex samples having real and imaginary components in each period of the digitized IF signal;
   performing an upsampling operation on the complex samples at an upsampling rate to provide additional zero value samples;
   performing a resampling operation on the upsampled complex samples to adjust the upsampling rate to provide an integer number of complex samples for each period of a waveform of the digitized IF signal; and
   performing a coherent averaging operation to accumulate samples in a memory of having a predetermined length, wherein the coherent averaging operation comprises time averaging n sample vectors of the complex samples to yield an averaged sample vector (n being an integer number of samples of two or more in one period of the waveform).

4. The method of claim 3, wherein performing the complex mixing operation comprises multiplying a cosine and a sine at each of the frequency bins of interest of the digital IF signal to provide the real and imaginary components of the samples.

5. The method of claim 3, wherein storing the frequency bins of interest comprises storing any contiguous subset of the plurality of first comb lines.

6. The method of claim 1, wherein filtering the RF signal comprises low pass filtering before digitizing the IF signal.

7. The method of claim 1, wherein frequencies of the plurality of second comb lines in the IF signal are lower than corresponding frequencies of the plurality of first comb lines in the RF signal.

8. The method of claim 1, wherein a digital mixing pattern of the multi-tone LO signal are determined such that the plurality of second comb lines of the IF signal to not overlap.

9. The method of claim 1, wherein the predetermined sampling rate used for digitizing the IF signal is compatible with sampling a period of the IF signal.

10. The method of claim 9, wherein digitizing the IF signal is performed by an analog-to-digital converter (ADC) having a clock rate equal to the predetermined sampling rate.

11. The method of claim 1, further comprising:
    resampling the digitized IF signal at a sampling rate compatible with sampling a period of the IF signal when the predetermined sampling rate used for digitizing the IF signal is not compatible.

12. The method of claim 1, further comprising:
    splitting the digitized IF signal into a first portion of the digitized IF signal and a second portion of the digitized IF signal, wherein descrambling the digitized IF signal with the time domain signal processing comprises descrambling the first portion of the digitized IF signal via a first path, and substantially simultaneously descrambling the second portion of the digitized IF signal via a second path;

performing fast Fourier transforms (FFTs) on frequencies of interest of the descrambled first portion of the digitized IF signal to provide first frequency domain samples;

performing FFTs on frequencies of interest of the descrambled second portion of the digitized IF signal to provide second frequency domain samples; and stitching the first and second frequency domain samples to provide a consolidated IF waveform of the digitized IF signal in the frequency domain.

13. The method of claim 12, wherein the stitching comprises selecting at least one frequency bin of interest from the first frequency domain samples and at least another frequency bin of interest from the second frequency domain samples.

14. A digital network analyzer configured to process an RF signal output by a DUT in response to a stimulus signal, according to the method of claim 1.

15. A digital network analyzer, comprising:
a mixer configured to mix a radio frequency (RF) signal output from a device under test (DUT) and a multi-tone local oscillator (LO) signal output from an LO signal generator for providing an intermediate frequency (IF) signal, wherein the RF signal includes first comb lines arranged in a predetermined first order, the LO signal includes an LO pattern, and the IF signal includes second comb lines corresponding to the first comb lines and arranged in a second order different from the first order;
analog-to-digital converter (ADC) configured to digitize the IF signal at a predetermined sampling rate; and
a descrambling module configured to descramble the digitized IF signal with time domain signal processing such that the second comb lines of the digitized IF signal are rearranged in the predetermined first order.

16. The digital network analyzer of claim 15, wherein the further comprising:
a low pass filter configured to filter the mixed RF and LO signals and to output the IF signal,
a capture memory configured to store frequency bins of interest of the descrambled IF signal, the frequency bins of interest including the second comb lines; and
a fast Fourier transform (FFT) module configured to perform FFTs on the stored frequency bins of interest of the descrambled IF signal to provide frequency domain samples corresponding to the digitized IF signal.

17. The digital network analyzer of claim 15, further comprising:
an RF signal generator configured to generate a multi-tone RF stimulus signal having an RF pattern, and to provide the RF stimulus signal to the DUT for providing the RF signal, wherein the first comb lines of the RF signal correspond to an RF pattern of the RF stimulus signal,
wherein the RF pattern of the RF stimulus signal comprises a wideband digital stimulus pattern, and the LO pattern of the LO signal comprises a wideband digital mixing pattern.

18. The digital network analyzer of claim 15, wherein the descrambling module comprises:
a complex mixing module configured to perform a complex mixing operation on the digitized IF signal to provide complex samples having real and imaginary components in each period of the digitized IF signal;
an upsampling module configured to perform an upsampling operation on the complex samples at an upsampling rate to provide additional zero value samples;
a resampling module configured to perform a resampling operation on the upsampled complex samples to adjust the upsampling rate to provide an integer number of complex samples for each period of a waveform of the digitized IF signal; and a coherent averaging module configured to perform a coherent averaging operation to accumulate samples in a memory of having a predetermined length, wherein the coherent averaging operation comprises time averaging an integer number of sample vectors of the complex samples to yield an averaged sample vector, the integer number of sample vectors being equal to the integer number of complex samples for each period of a waveform of the digitized IF signal.

19. The digital network analyzer of claim 15, wherein the descrambling module comprises:
a first path, comprising:
a first complex mixing module configured to perform a first complex mixing operation on a first portion of the digitized IF signal to provide first complex samples;
a first upsampling module configured to perform a first upsampling operation on the first complex samples at a first upsampling rate to provide additional zero value samples;
a first resampling module configured to perform a first resampling operation on the upsampled complex samples to adjust the upsampling rate to provide an integer number of first complex samples for each period of a waveform of the digitized IF signal; and
a first coherent averaging module configured to perform a first coherent averaging operation to accumulate samples in a first memory having a predetermined length, wherein the first coherent averaging operation comprises time averaging an integer number of sample vectors of the first complex samples to yield a first averaged sample vector, the integer number of sample vectors being equal to the integer number of first complex samples for each period of a waveform of the digitized IF signal; and
a second path, comprising:
a second complex mixing module configured to perform a second complex mixing operation on a second portion of the digitized IF signal to provide second complex samples, the second complex mixing operation effectively rotating a spectrum of the second portion of the IF signal;
a second upsampling module configured to perform a second upsampling operation on the second complex samples at a second upsampling rate to provide additional zero value samples;
a second resampling module configured to perform a second resampling operation on the upsampled complex samples to adjust the upsampling rate to provide an integer number of second complex samples for each period of a waveform of the digitized IF signal; and
a second coherent averaging module configured to perform a second coherent averaging operation to accumulate samples in a second memory having a predetermined length, wherein the second coherent averaging operation comprises time averaging an integer number of sample vectors of the second complex samples to yield a second averaged sample vector, the integer number of sample vectors being equal to the integer number of second complex samples for each period of the waveform of the digitized IF signal.

20. The digital network analyzer of claim 19, further comprising:
- a first fast Fourier transform (FFT) module configured to perform FFTs on frequency bins of interest of the accumulated samples in the first memory to provide frequency domain first samples corresponding to the first portion of the digitized IF signal;
- a second FFT module configured to perform FFTs on frequency bins of interest of the accumulated samples in the second memory to provide frequency domain second samples corresponding to the second portion of the digitized IF signal; and
- a stitching module configured to provide a consolidated IF waveform of the digitized IF signal in the frequency domain by extracting measurement results from the first and second FFT modules and selecting frequency bins of interest.

* * * * *